(12) United States Patent
Takasu (10) Patent No.: US 10,479,047 B2
(45) Date of Patent: Nov. 19, 2019

(54) FOAM COMPOSITE SHEET

(71) Applicant: SEKISUI CHEMICAL CO., LTD., Osaka (JP)

(72) Inventor: Kenichiro Takasu, Hasuda (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 0 days.

(21) Appl. No.: 15/322,569

(22) PCT Filed: Jul. 31, 2015

(86) PCT No.: PCT/JP2015/071787
§ 371 (c)(1),
(2) Date: Dec. 28, 2016

(87) PCT Pub. No.: WO2016/047272
PCT Pub. Date: Mar. 31, 2016

(65) Prior Publication Data
US 2017/0151750 A1    Jun. 1, 2017

(30) Foreign Application Priority Data

Sep. 25, 2014 (JP) ................................. 2014-195531

(51) Int. Cl.
*B32B 5/18* (2006.01)
*B29C 48/08* (2019.01)
(Continued)

(52) U.S. Cl.
CPC ............ *B32B 5/18* (2013.01); *B29C 35/0866* (2013.01); *B29C 48/022* (2019.02); *B29C 48/08* (2019.02);
(Continued)

(58) Field of Classification Search
CPC .......... B32B 5/18; B32B 15/046; B32B 15/20
See application file for complete search history.

(56) References Cited

U.S. PATENT DOCUMENTS 5,127,643 A * 7/1992 DeSanctis ............... B65H 7/02
                                                    177/1
6,309,742 B1 * 10/2001 Clupper .................... B32B 5/18
                                                    427/247
(Continued)

FOREIGN PATENT DOCUMENTS

JP    6-238784         8/1994
JP    09157601 A *     6/1997
(Continued)

OTHER PUBLICATIONS

Translation of JP 2009 221237, Okada et al., Oct. 1, 2009, p. 1-19. (Year: 2009).*
(Continued)

*Primary Examiner* — Hai Vo
(74) *Attorney, Agent, or Firm* — Wenderoth, Lind & Ponack, L.L.P.

(57) ABSTRACT

The foam composite sheet of the present invention comprises a polyolefin resin foam sheet and a metallic thin film provided on at least one surface of the foam sheet, the metallic thin film being formed of a material selected from metals, alloys containing a plurality of metals, and the like, in an amount of deposition of 5 to 1,000 μg/cm².

9 Claims, 2 Drawing Sheets (51) Int. Cl.
  *B29C 48/00* (2019.01)
  *B32B 9/00* (2006.01)
  *B32B 27/32* (2006.01)
  *C23C 14/20* (2006.01)
  *C23C 14/34* (2006.01)
  *B29C 35/08* (2006.01)
  *B32B 15/04* (2006.01)
  *B32B 15/20* (2006.01)
  *C09J 7/29* (2018.01)
  *B29K 105/04* (2006.01)
  *B29L 7/00* (2006.01)
  *B29L 9/00* (2006.01)
  *B29K 105/00* (2006.01)
  *B29C 44/56* (2006.01)
  *B29C 44/50* (2006.01)

(52) U.S. Cl.
  CPC .............. *B32B 9/00* (2013.01); *B32B 15/046* (2013.01); *B32B 15/20* (2013.01); *B32B 27/32* (2013.01); *C09J 7/29* (2018.01); *C23C 14/20* (2013.01); *C23C 14/205* (2013.01); *C23C 14/34* (2013.01); *B29C 44/505* (2016.11); *B29C 44/56* (2013.01); *B29C 2035/085* (2013.01); *B29C 2035/0872* (2013.01); *B29C 2035/0877* (2013.01); *B29K 2023/06* (2013.01); *B29K 2105/0047* (2013.01); *B29K 2105/0061* (2013.01); *B29K 2105/04* (2013.01); *B29K 2105/046* (2013.01); *B29K 2995/0063* (2013.01); *B29K 2995/0097* (2013.01); *B29L 2007/007* (2013.01); *B29L 2009/008* (2013.01); *C09J 2201/606* (2013.01); *C09J 2203/326* (2013.01); *C09J 2400/163* (2013.01); *C09J 2423/006* (2013.01); *C09J 2423/046* (2013.01); *Y10T 428/24999* (2015.04); *Y10T 428/249976* (2015.04); *Y10T 428/249983* (2015.04)

(56) References Cited

U.S. PATENT DOCUMENTS

| | | | |
|---|---|---|---|
| 6,569,789 B1 * | 5/2003 | Shioda | H05K 9/0015 428/304.4 |
| 2003/0213939 A1 * | 11/2003 | Narayan | B82Y 10/00 252/500 |
| 2008/0157915 A1 * | 7/2008 | Lin | B32B 27/18 336/84 C |
| 2010/0151238 A1 * | 6/2010 | Burmeister | C09J 7/29 428/344 |
| 2013/0133942 A1 * | 5/2013 | Kandoor | H05K 9/0015 174/388 |
| 2014/0356615 A1 * | 12/2014 | Komatsuzaki | C09J 7/26 428/315.5 |

FOREIGN PATENT DOCUMENTS

| | | | |
|---|---|---|---|
| JP | 2001-179866 | | 7/2001 |
| JP | 2001-348544 | | 12/2001 |
| JP | 2009221237 A | * | 10/2009 |
| JP | 2011-96989 | | 5/2011 |
| JP | 2012-214800 | | 11/2012 |
| JP | 2013-57948 | | 3/2013 |

OTHER PUBLICATIONS

Abstract Translation of JP 09 157601, Masabumi Nishino, Jun. 17, 1997, 2 pages (Year: 1997).*
International Search Report dated Sep. 29, 2015 in International (PCT) Application No. PCT/JP2015/071787.

* cited by examiner

FOAM COMPOSITE SHEET

TECHNICAL FIELD

The present invention relates to a foam composite sheet including a metallic thin film provided on the surface of a polyolefin rein foam sheet.

BACKGROUND ART

Conventionally, a foam material is used in various applications; for example, a foam material is used as a thermal insulator. Although a foam material is used singly as a thermal insulator in some cases, a foam material having a surface provided with a metallic thin film for enhancing the effect of heat insulation is also known, for example, as disclosed in PTL1. The metallic thin film of the foam material has a thickness of 10 to 1,000 μm, and is adhered to the foam material, for example, with an adhesive.

A foam material formed into a thin sheet with a thickness of several tens of um to several mm is used as a sealing material or an impact absorber of various electronic apparatuses in some cases. For example, a foam material is disposed on the rear side of a display device in a laptop PC, a cellular phone, an electronic paper display or the like, so as to absorb the impact or the vibration exerted on the display device. In addition, a foam material as a sealing material fills the gap inside an electronic apparatus to prevent dust and water from entering the inside of the apparatus. Examples of the well-known foam material for use in these applications include a polyolefin resin foam sheet (for example, refer to PTL2).

CITATION LIST

Patent Literature

PTL1: JP 2001-179866 A
PTL2: JP 2012-214800 A

SUMMARY OF INVENTION

Technical Problem

In recent years, various electronic apparatuses have been down-sized and highly integrated, so that the amount of heat generated from each electronic component such as CPU has increased. It has been therefore required to efficiently radiate the heat generated inside an apparatus to the outside. It has been also required to prevent the transfer of the heat generated inside an apparatus to a specific region, such that no problem occurs in a specific device such as a display device. Accordingly, imparting the heat radiation or insulation function to a foam material that is used as an impact absorber or a sealing material inside an electronic apparatus has been investigated by the present inventor.

However, since the foam material for use as an impact absorber or a sealing material inside an electronic apparatus has a thickness of several mm or less, it is difficult to enhance the effect of heat insulation by the foam material singly. On the other hand, although the foam material described in PTL1 has high heat insulation performance, the impact absorption performance is hardly enhanced due to the low flexibility from the nature of the material. In addition, the foam material typically has a large thickness, and therefore, the foam material is difficult to be accommodated inside an electronic apparatus. Furthermore, since the metallic thin film provided on one surface of the foam material has a large thickness and is adhered to the foam material with an adhesive, the flexibility of the foam material is further lowered by the metallic thin film and the adhesive, and thus the use thereof as an impact absorber or a sealing material for an electronic apparatus is difficult.

The present invention has been made in view of these problems, and an object of the present invention is to provide a foam composite sheet excellent in the impact absorption performance or the sealing properties, and having a high heat insulation or radiation effect in parallel.

Solution to Problem

Through extensive investigation, the present inventor has found that the problem can be solved by providing an ultra-thin metallic film on at least one surface of a polyolefin resin foam sheet, thus accomplishing the present invention described below.

The present invention provides the following (1) to (9).
(1) A foam composite sheet comprising a polyolefin resin foam sheet and a metallic thin film provided on at least one surface of the foam sheet, the metallic thin film being formed of one or more material selected from the group consisting of metals, metal oxides and metal nitrides, in an amount of deposition of 5 to 1,000 μg/cm$^2$.
(2) The foam composite sheet according to item (1), wherein the metallic thin film is formed of at least one selected from the group consisting of stainless steel, MONEL®, aluminum, copper, silver, titanium and nickel.
(3) The foam composite sheet according to item (1) or (2), wherein the polyolefin resin foam sheet has a thickness of 0.05 to 1.0 mm.
(4) The foam composite sheet according to any of items (1) to (3), wherein the polyolefin resin foam sheet has an apparent expansion ratio of 1.0 to 10 cc/g.
(5) The foam composite sheet according to any of items (1) to (4), wherein the polyolefin resin foam sheet has a gel fraction of 5 to 70 mass %.
(6) The foam composite sheet according to any of items (1) to (5), wherein the polyolefin resin foam sheet is formed of a foamed resin composition comprising a polyethylene resin.
(7) The foam composite sheet according to any of items (1) to (6), wherein the metallic thin film is formed by sputtering.
(8) The foam composite sheet according to any of items (1) to (7), wherein the polyolefin resin foam sheet comprises a thermally conductive filler dispersed therein.
(9) A pressure sensitive adhesive tape comprising the foam composite sheet according to any one of items (1) to (8) and a pressure sensitive adhesive layer provided on at least one surface of the foam composite sheet.

Advantageous Effects of Invention

According to the present invention, a foam composite sheet excellent in the impact absorption performance or the sealing properties, and having a high heat insulation or radiation effect in parallel, can be provided.

DESCRIPTION OF EMBODIMENTS

The present invention will be further described in detail with reference to embodiments as follows.

The foam composite sheet of the present invention includes a polyolefin resin foam sheet and a metallic thin film provided on at least one surface of the foam sheet.

[Polyolefin Resin Foam Sheet]

A polyolefin resin foam sheet (hereinafter, also referred to simply as "foam sheet") is formed of a foamed polyolefin resin composition (hereinafter, "polyolefin resin composition" is also referred to simply as "resin composition"). Examples of the polyolefin resin to constitute the resin composition include a polyethylene resin, a polypropylene resin, and a mixture thereof, and, among them, a polyethylene resin is preferred. More specific examples thereof include a polyethylene resin, a polypropylene resin and a mixture thereof that are polymerized with a polymerization catalyst such as a Ziegler-Natta compound, a metallocene compound and a chromium oxide compound. Among them, a polyethylene resin polymerized with a polymerization catalyst of metallocene compound is preferred. When the polyethylene resin obtained using a polymerization catalyst of metallocene compound is used, a foam sheet can be easily obtained that has high mechanical strength and high impact absorption properties even with a small thickness.

Examples of the polyethylene resin include an ethylene homopolymer, an ethylene-α-olefin copolymer and an ethylene-vinyl acetate copolymer. The ethylene-α-olefin copolymer is a polyethylene resin mainly composed of ethylene (typically 70 mass % or more, preferably 90 mass % or more, in the total monomers), which can be obtained by copolymerization of ethylene and α-olefin. Specific examples of the α-olefin to constitute the polyethylene resin include propylene, 1-butene, 1-pentene, 4-methyl-1-pentene, 1-hexene, 1-heptene and 1-octene.

Examples of the ethylene-vinyl acetate copolymer include a copolymer typically containing ethylene in an amount of 50 mass % or more in the total monomers.

The polyethylene resin may be any of a straight-chain low-density polyethylene, a low-density polyethylene, a medium-density polyethylene and a high-density polyethylene.

Examples of the polypropylene resin include a propylene homopolymer, and a propylene-α-olefin copolymer mainly composed of propylene (typically 70 mass % or more, preferably 90 mass % or more, in the total monomers), which can be obtained by copolymerization of propylene and α-olefin. One of these may be used singly, or two or more may be used in combination.

Specific examples of the α-olefin to constitute the propylene-α-olefin copolymer include ethylene, 1-butene, 1-pentene, 4-methyl-1-pentene, 1-hexene, 1-heptene and 1-octene.

<Metallocene Compound>

Examples of the metallocene compound suitable for use in manufacturing a polyolefin resin include a compound such as a bis(cyclopentadienyl) metal complex, which has a structure containing a transition metal held by an unsaturated compound having a π electron system. More specific examples include a compound containing a tetravalent transition metal such as titanium, zirconium, nickel, palladium, hafnium and platinum with presence of one or more cyclopentadienyl rings or analogs thereof as ligands.

Such a metallocene compound includes active sites with uniform properties, so that each active site has the same activity. As a result, a polymer synthesized with the metallocene compound has high uniformity of the molecular weight, the molecular weight distribution, the composition and the composition distribution. Accordingly, in cross-linking of a sheet including a polymer synthesized with the metallocene compound, the cross-linking proceeds uniformly. A uniformly cross-linked sheet tends to be uniformly stretched. Thus, a foam sheet having a uniform thickness can be easily obtained, and therefore a high performance can be easily maintained even when reducing the thickness.

Examples of the ligand include a cyclopentadienyl ring and an indenyl ring. These cyclic compounds may be substituted with a hydrocarbon group, a substituted hydrocarbon group or a hydrocarbon-substituted metalloid group. Examples of the hydrocarbon group include a methyl group, an ethyl group, various propyl groups, various butyl groups, various amyl groups, various hexyl groups, a 2-ethylhexyl group, various heptyl groups, various octyl groups, various nonyl groups, various decyl groups, various cetyl groups, and a phenyl group. Herein, the term "various" means encompassing various isomers including n-, sec-, tert-, and iso-.

Alternatively, a cyclic compound polymerized to form an oligomer may be used as the ligand.

Besides the unsaturated compound with a π electron system, a monovalent anionic ligand such as chlorine and bromine or a divalent anionic chelate ligand, hydrocarbon, alkoxide, aryl amide, aryl oxide, amide, aryl amide, phosphide, aryl phosphide, etc., may be used.

Examples of the metallocene compound containing a tetravalent transition metal and ligands include cyclopentadienyl titanium tris(dimethyl amide), methyl cyclopentadienyl titanium tris(dimethyl amide), bis(cyclopentadienyl) titanium dichloride and dimethylsilyl tetramethyl cyclopentadienyl-t-butyl amide zirconium dichloride.

The metallocene compound combined with a specific co-catalyst (promoter) functions as a catalyst during polymerization of various olefins. Specific examples of the co-catalyst include methylaluminoxane (MAO) and a boron compound. The molar ratio of the co-catalyst to the metallocene compound for use is preferably 10 to 1,000,000, more preferably 50 to 5,000.

<Ziegler-Natta Compound>

The Ziegler-Natta compound is a solid composite of triethyl aluminum-titanium tetrachloride, which is preferably manufactured by: a method including combining a titanium trichloride composition which is produced by reducing titanium tetrachloride with an organic aluminum compound and then processing the reduced product with an electron donator and an electron acceptor; an organic aluminum compound; and an aromatic carboxylic acid ester (refer to each of JP 56-100806 A, JP 56-120712 A and JP 58-104907 A); or a carrier-type catalyst method including contacting magnesium halide with titanium tetrachloride and various electron donators (refer to each of JP 57-63310 A, JP 63-43915 A and JP 63-83116 A).

The resin composition may contain a resin component other than the polyolefin resin as long as the object of the present invention is interfered. Examples of the resin component include a thermoplastic styrene elastomer, an ethylene-propylene rubber (EPM) and an ethylene-propylene-diene rubber (EPDM). The content of the resin component other than the polyolefin resin is typically 30 mass % or less, preferably 10 mass % or less, relative to the total content of the resin components in the composition.

(Thermally Conductive Filler)

The polyolefin resin foam sheet may comprise a thermally conductive filler dispersed therein. The thermally conductive filler enhances the thermal conductivity of a foam sheet, so that the heat radiation effect of the foam sheet tends to be enhanced. In addition, part of the thermally conductive filler is in contact with a metallic thin film, and thus, the heat radiation effect of the metallic thin film tends to be enhanced.

Examples of the thermally conductive filler include aluminum oxide, magnesium oxide, boron nitride, talc, aluminum nitride, graphite and graphene. Among them, aluminum oxide and magnesium oxide are preferred, and magnesium oxide is more preferred. One of these may be used singly, or two or more may be used in combination.

The thermally conductive filler having an average particle diameter of, preferably 0.1 to 100 μm, more preferably 0.5 to 50 μm can be used. In the present invention, an average particle diameter is the volume average particle diameter measured by a Microtrac particle size analyzer MT3300EX (manufactured by Nikkiso Co., Ltd.).

The content of the thermally conductive filler is preferably 100 to 500 parts by mass relative to 100 parts by mass of resin component in a foam sheet. With a content of the thermal conductor of 100 parts by mass or more, sufficient thermal conductivity can be imparted to a foam sheet, and with a content of the thermal conductor of 500 parts by mass or less, the reduction in the flexibility of a foam sheet can be prevented. In view of the thermal conductivity and the flexibility of a foam sheet, the content of the thermal conductor is preferably 120 to 480 parts by mass, more preferably 150 to 450 parts by mass, relative to 100 parts by mass of resin component.

The polyolefin resin foam sheet with a thermally conductive filler dispersed is formed of a foamed resin composition containing a thermally conductive filler. A resin composition may contain a thermally decomposable foaming agent to be described below, an organic peroxide for cross-linking, and other various additives such as a cross-linking aid, an antioxidant, a foaming aid, a cell nucleus adjusting agent, a thermal stabilizer, a colorant, a flame retardant, an antistatic agent and a filler, which are added on an as needed basis, as long as the physical properties of a foam sheet is not impaired.

The foam sheet of the present invention preferably has closed cells. Having closed cells, the foam sheet can be a sealing material having the effect of highly preventing infiltration of water, dust and the like. In addition, the deformation of the cells is reduced under impact, so that the deformation of the foam sheet is reduced under impact. Accordingly, the impact absorption performance tends to be enhanced.

The foam sheet having closed cells means a foam sheet having a proportion of closed cells of 70% or more. The proportion of closed cells is measured in accordance with ASTMD 2856-94. The proportion of the closed cells of a foam sheet is preferably 90% or more.

The foam sheet has an apparent expansion ratio of preferably 1.0 to 10 cc/g, more preferably 1.3 to 6 cc/g. With an apparent expansion ratio in the range, an appropriate mechanical strength and excellent flexibility can be achieved and the sealing properties and the impact absorption properties tend to be enhanced.

The foam sheet of the present invention has a thickness of preferably 0.05 to 1.0 mm. In the present invention, with a thickness of the foam sheet of 0.05 mm or more, the flexibility and the strength required for an impact absorber or a sealing material can be obtained. With a thickness of 1.0 mm or less, application to a narrow gap in various down-sized electronic apparatuses can be achieved. From the viewpoint described above, the foam sheet has a thickness of more preferably 0.1 to 0.6 mm.

The foam sheet of the present invention is cross-linked to have a gel fraction, which indicates the degree of cross-linking of a foam sheet, of preferably 5 to 70 mass %, more preferably 10 to 50 mass %. With a gel fraction of the lower limit or more, sufficient cross-linking is formed in a foam sheet, allowing more excellent mechanical strength, etc., of the foam material to be achieved. With a gel fraction of the upper limit or less, excellent flexibility of a foam sheet can be achieved, so that the sealing properties and the impact absorption properties tend to be improved.

[Metallic Thin Film]

The metallic thin film of the present invention is provided on one surface or both surfaces of a foam sheet, preferably on one surface. The metallic thin film is formed of one or more materials selected from the group consisting of metals, metal oxides and metal nitrides, and an amount of deposition of the metallic thin film is 5 to 1,000 μg/cm$^2$.

A foam composite sheet with such a metallic thin film can reflect radiant heat without impairing the flexibility of the foam sheet, having enhanced thermal conductivity and excellent radiation properties. As a result, a foam composite sheet excellent in impact absorption properties or sealing properties, and having high heat insulation or radiation function in parallel, can be obtained.

From the viewpoint described above, the amount of a metallic thin film deposited is more preferably 10 to 200 μg/cm$^2$. The amount of a metallic thin film deposited is a weight per area obtained by observation with X-ray as described in Examples below.

The metal to form a metallic thin film is preferably one or more selected from the group consisting of metals such as aluminum, copper, silver, nickel and titanium, and alloys formed of a plurality of metals such as stainless steel and MONEL® (a line of nickel-copper alloys). Examples of the metal oxide to form a metallic thin film include one or more selected from the group consisting of aluminum oxide, zinc oxide and the like. Examples of the metal nitride include one or more selected from the group consisting of titanium nitride and the like.

Among them, metals are preferred due to having a high effect of shielding and reflecting radiation heat. Aluminum, stainless steel and titanium are more preferred, and aluminum is still more preferred due to having a high effect of reflecting radiation heat.

The metallic thin film of the present invention is preferably formed on a foam sheet by sputtering. Although an ultra-thin metallic film may be formed by metal evaporation and the like, sputtering is preferred in view of low processing temperature leading to the prevention of the thermal degradation of a foam material, and easily obtaining a metallic thin film with a uniform thickness.

(Manufacturing Method of Foam Composite Sheet)

The foam composite sheet of the present invention is obtained by the manufacturing method described below, in which a metallic thin film is provided on one or both surfaces of a foam sheet by means such as sputtering.

The foam sheet is manufactured by cross-linking a resin composition and then causing the composition to foam, though not specifically limited to. For example, a manufacturing method including the following steps (1) to (3) is industrially advantageous.

Step (1): A step of supplying a polyolefin resin, a thermally decomposable foaming agent, and other additives and resin components such as a thermally conductive filler to be added on an as needed basis, to an extruder so as to be melt-kneaded, and extruding the kneaded product from the extruder to obtain a resin composition in a sheet form.

Step (2): A step of cross-linking the resin composition in a sheet form.

Step (3): A step of heating the cross-linked resin composition in a sheet form to cause the thermally decomposable foaming agent to foam, and stretching the sheet preferably in one or both of the MD direction and the CD direction.

As the thermally decomposable foaming agent, an organic or inorganic chemical foaming agent having a decomposition temperature of, for example, about 160° C. to 270° C. can be used.

Examples of the organic foaming agent include: an azo compound such as azodicarbonamide, a metal azodicarboxylate (e.g. barium azodicarboxylate) and azobisisobutyronitrile; a nitroso compound such as N,N'-dinitrosopentamethylenetetramine; a hydrazine derivative such as hydrazodicarbonamide, 4,4'-oxybis(benzenesulfonyl hydrazide) and toluenesulfonyl hydrazide; and a semicarbazide compound such as toluenesulfonyl semicarbazide.

Examples of the inorganic foaming agent include an acid ammonium, sodium carbonate, ammonium hydrogen carbonate, sodium hydrogen carbonate, ammonium nitrite, sodium borohydride and monosodium citrate anhydrate.

Among them, in view of obtaining fine cells and in view of economic efficiency and safety, an azo compound and a nitroso compound are preferred, azodicarbonamide, azobisisobutyronitrile and N,N'-dinitrosopentamethylenetetramine are more preferred, and azodicarbonamide is particularly preferred. These thermally decomposable foaming agents may be used singly or may be used in combinations of two or more.

The content of a thermally decomposable foaming agent for appropriate foaming without rupture of the cells in the foam sheet is preferably 1 to 25 parts by mass, more preferably 1 to 20 parts by mass, relative to 100 parts by mass of the polyolefin resin. In the case of using a thermally conductive filler, however, a smaller amount of foaming agent is insufficient for adequate foaming. In such a case, the content is preferably 3 to 25 parts by mass, more preferably 5 to 20 parts by mass, accordingly. On the other hand, in the case of using no thermally conductive filler, the content is preferably 1 to 12 parts by mass, more preferably 1 to 8 parts by mass. With a content of the thermally decomposable foaming agent in the range described above, the foaming properties of a resin composition is improved, so that a foam sheet having a desired expansion ratio tends to be obtained and a foam composite sheet excellent in impact absorption properties and sealing properties can be thus obtained.

Examples of the method for foaming by decomposing a thermally decomposable agent include a method including heating a resin composition by hot air, infrared, salt bath, oil bath, or the like, which may be used in combination, though not specifically limited to.

Examples of the method for cross-linking a resin composition include a method including irradiating the resin composition with ionizing radiation such as electron beam, α ray, β ray and γ ray, and a method including adding an organic peroxide to the resin composition in advance and then heating the resin composition for decomposition of the organic peroxide. These methods may be used in combination. Among them, an irradiation method using an ionizing radiation is preferred.

In order to achieve a gel fraction of 5 to 70 mass %, the amount of irradiation of the ionizing radiation is preferably 0.5 to 10 Mrad, more preferably 1 to 8 Mrad.

Examples of the organic peroxide for use in cross-linking include 1,1-bis(t-butylperoxy)3,3,5-trimethylcyclohexane, 1,1-bis(t-butylperoxy)cyclohexane, 2,2-bis(t-butylperoxy) octane, n-butyl-4,4-bis(t-butylperoxy)valerate, di-t-butylperoxide, t-butylcumylperoxide, dicumylperoxide, α,α'-bis(t-butylperoxy-m-isopropyl)benzene, 2,5-dimethyl-2,5-di(t-butylperoxy)hexane, 2,5-dimethyl-2,5-di(t-butylperoxy) hexyne-3, benzoyl peroxide, cumyl peroxyneodecanate, t-butyl peroxybenzoate, 2,5-dimethyl-2,5-di(benzoylperoxy)hexane, t-butylperoxyisopropylcarbonate and t-butylperoxyallylcarbonate. One of these may be used singly, or two or more may be used in combination. The amount of the organic peroxide added is preferably 0.01 to 5 parts by mass, more preferably 0.1 to 3 parts by mass, relative to 100 parts by mass of the polyolefin resin. With an amount of the organic peroxide added in the range described above, the cross-linking of the resin composition easily proceeds and the amount of residual decomposed organic peroxide remaining in the resulting foam sheet can be reduced.

Preferably the foam sheet is stretched as described above. The stretching may be performed after foaming of the resin composition, or during foaming of the resin composition. In the case of stretching the foam sheet after foaming of the resin composition, it is better that the foam sheet is stretched while maintaining the molten or softened state in foaming, without cooling of the foam sheet. Alternatively, the foam sheet may be cooled and then heated to a molten or softened state again for stretching.

In the present invention, foaming of the resin composition may be performed by physical foaming. In this case, preferably the resin composition is impregnated with a physical foaming agent instead of using the thermally decomposable foaming agent. The impregnation of a physical foaming agent is preferably performed into a resin composition formed into a sheet in step (1) for example. In the case of physical foaming, the heating for foaming in step (3) is unnecessary.

As the physical foaming agent for impregnation in a resin composition in a sheet form, preferably a high-pressure inert gas is used. The inert gas is not specifically limited as long as the gas is inert to the resin composition and can penetrate through the resin composition. Examples of the gas include carbon dioxide, nitrogen gas and air. These gases may be mixed for use. Among them, carbon dioxide is suitable, allowing the resin for use as a foam material to be impregnated with a large amount of the gas at a high impregnation rate. Further, carbon dioxide is preferred in view of obtaining a clean resin foam material with a reduced amount of impurities. When the resin composition is impregnated with the inert gas, the gas is preferably in a supercritical state or a subcritical state.

[Usage of Foam Composite Sheet]

The foam composite sheet of the present invention is used, for example, inside an electronic apparatus. As the electronic apparatus, a portable apparatus such as a cellular phone, a tablet terminal, an electronic paper display, a laptop PC, a video camera and a digital camera is preferred. The foam composite sheet is fixed to a specific member inside an electronic apparatus or provided on the periphery of the member for use as an impact absorber to prevent the member from being subjected to impact loading. The foam composite sheet is also used as a sealing material which fills the gap inside an electronic apparatus to prevent dust and water from entering the inside of the electronic apparatus.

Since the foam composite sheet of the present invention has a function to reflect radiation heat, the sheet is disposed, for example, between a heat source and a specific member so as to prevent the heat generated from the heat source inside an electronic apparatus from transferring to the specific member. Furthermore, the metallic thin film, or the metallic thin film and the thermally conductive filler, can diffuse or radiate the heat generated from a heat source. In other words, the composite sheet of the present invention can be used as an impact absorber or a sealing material, while being used as a thermal insulator or a radiator in parallel.

Figure 1:
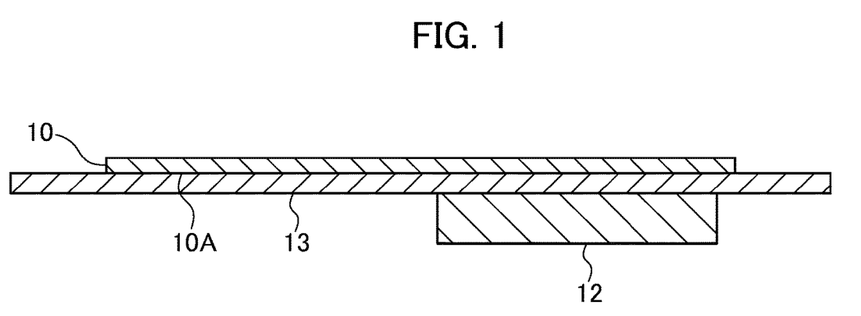
FIG. 1 is a schematic cross-sectional view illustrating an exemplified usage of a foam composite sheet.

For example, as shown in FIG. 1, a foam composite sheet 10 is disposed on a heat sink 13 having a plate-shape for radiating heat generated from a heat source 12, and the foam composite sheet 10 has a function to diffuse the heat generated from the heat source 12 and to radiate the heat to the outside of the electronic apparatus together with the heat sink 13. In the case of the foam composite sheet 10 provided with a metallic thin film on one surface only, preferably a surface 10A provided with the metallic thin film is disposed on the heat sink 13 side (i.e. in contact with the heat sink 13). Such a structure allows the metallic thin film together with the heat sink 13 to easily radiate the heat from the heat source 12. As shown in FIG. 1, for example, the foam composite sheet 10 is provided such that the heat sink 13 is disposed between the sheet 10 and the heat source 12.

Figure 2:
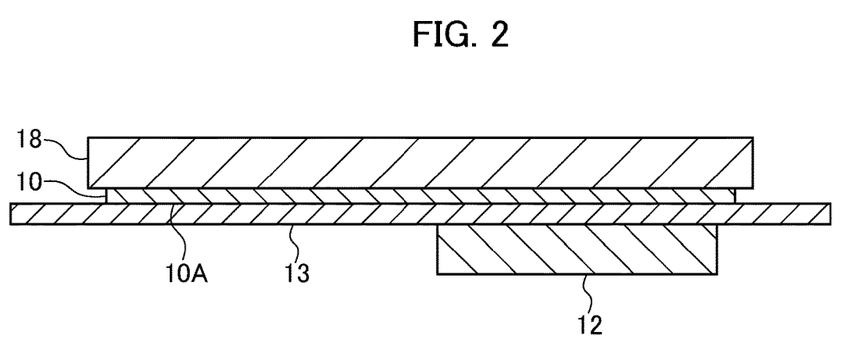
FIG. 2 is a schematic cross-sectional view illustrating another exemplified usage of a foam composite sheet.

The foam composite sheet 10 provided on the heat sink 13 is used, for example, as an impact absorber for various members such as a display device, or as a sealing material to fill the gap inside an electronic apparatus. Accordingly, as shown in FIG. 2, for example, a specific member such as a display device 18 is further disposed above the foam composite sheet 10. According to the disposition shown in FIG. 2, the foam composite sheet 10 is disposed between a specific member (display device 18) and the heat source 12, so as to reflect radiation heat and transfer heat along the surface direction through the metallic thin film for radiation. The transfer of the heat generated from the heat source 12 to the specific member is thus prevented.

Furthermore, in the structures shown in FIGS. 1 and 2, the foam composite sheet 10 has the surface 10A provided with a metallic thin film, which is directed toward the heat source 12, so that the metallic thin film has an enhanced effect of the reflection of radiation heat. Examples of the heat source 12 include a CPU and a battery. The heat sink 13 is formed of a metal member such as stainless steel, a heat diffusion sheet that is of graphite sheet, or a laminate of a metal member and a heat diffusion sheet.

In the structures shown in FIGS. 1 and 2, preferably the foam composite sheet 10 includes a foam sheet containing no thermally conductive filler.

Figure 3:
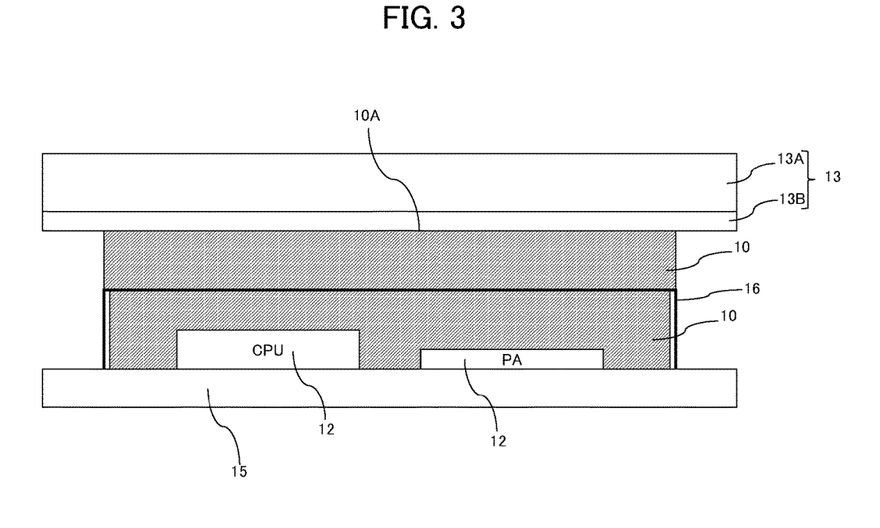
FIG. 3 is a schematic cross-sectional view illustrating still another exemplified usage of a foam composite sheet.

As shown in FIG. 3, the foam composite sheet 10 of the present invention may be disposed between the heat source 12 and the heat sink 13. In this case, preferably the foam composite sheet 10 includes a foam sheet comprising a thermally conductive filler.

The foam composite sheet 10 comprising a thermally conductive filler is excellent in thermal conductivity and radiation properties as described above. Accordingly, the foam composite sheet 10 together with the heat sink 13 can radiate the heat generated from the heat source 12.

In the case of the foam composite sheet 10 disposed between the heat source 12 and the heat sink 13, the surface 10A provided with a metallic thin film is also preferably disposed on the heat sink 13 side (i.e. in contact with the heat sink 13). In this case, although the foam composite sheet 10 may have metallic thin films on both surfaces of the foam sheet, preferably the sheet has a metallic thin film on one surface only. The metallic thin film in contact with the heat sink 13 as described above tends to enhance the heat radiation effect.

In the structure shown in FIG. 3, a CPU and a power amplifier (PA) as heat sources 12 are provided on a substrate 15, and the CPU and the power amplifier are disposed in an enclosure 16. Accordingly, the foam composite sheets 10 are disposed both between the heat source 12 and the enclosure 16 and between the enclosure 16 and the heat sink 13. The enclosure 16 is, for example, an electromagnetic wave shield for shielding electromagnetic waves. When the enclosure 16 is omitted, the structure may include one foam composite sheet 10 provided between the heat source 12 and the heat sink 13.

As shown in FIG. 3, it is preferable that the heat sink 13 has a laminate structure of a metal member 13A such as SUS and a heat diffusion sheet 13B that is of a graphite sheet and the heat diffusion sheet 13B is directed toward the heat source 12 and in contact with a metallic thin film provided on one surface 10A of the foam composite sheet 10.

The foam composite sheet 10 is preferably disposed in a compressional state in the thickness direction for use. In other words, in FIGS. 2 and 3, the foam composite sheet 10 disposed between the heat sink 13 and the display device 18, and the foam composite sheet 10 disposed between the heat sink 13 and the heat source 12, are in a compressional state in the thickness direction. As a result, for example, in the structure shown in FIG. 3, the foam composite sheet 10 is deformed corresponding to the irregularities of the upper surface side of the substrate 15 where the heat source 12 is provided.

[Pressure Sensitive Adhesive Tape]

The pressure sensitive adhesive tape of the present invention includes a foam composite sheet and a pressure sensitive adhesive layer provided on one or both surfaces of the foam composite sheet. The pressure sensitive adhesive layer may be provided on the surface provided with the metallic thin film of the foam composite sheet, or may be provided on the surface without a metallic thin film. Preferably the metallic thin film is provided on one surface of the foam composite sheet and the pressure sensitive adhesive layer is provided on the other surface.

The thickness of the pressure sensitive adhesive layer is preferably 5 to 200 μm, more preferably 7 to 150 μm, still more preferably 10 to 100 μm. With a thickness of the pressure sensitive adhesive layer to constitute a pressure sensitive adhesive tape in the range of 5 to 200 μm, the thickness of a structure fixed with the pressure sensitive adhesive tape can be thin.

The pressure sensitive adhesive to constitute the pressure sensitive adhesive layer is not specifically limited, and examples thereof include an acrylic pressure sensitive adhesive, a urethane pressure sensitive adhesive and a rubber pressure sensitive adhesive. Examples of the method for forming a pressure sensitive adhesive layer by applying a pressure sensitive adhesive on at least one surface of a foam composite sheet include a method including applying a pressure sensitive adhesive on at least one surface of a foam composite sheet using a coating machine such as a coater, a method including applying a pressure sensitive adhesive on at least one surface of a foam composite sheet by spraying, and a method including applying a pressure sensitive adhesive on at least one surface of a foam composite sheet with a brush.

The pressure sensitive adhesive layer in the pressure sensitive adhesive tape may be provided by applying the pressure sensitive adhesive to form a pressure sensitive adhesive layer only on one or both surfaces of a foam composite sheet as described above, or may be provided as a part of a double-sided pressure sensitive adhesive tape. In other words, a double-sided pressure sensitive adhesive tape may be adhered to one or both surfaces of a foam composite sheet.

The double-sided pressure sensitive adhesive tape includes a base material, and a first and a second pressure sensitive adhesive layer, each of them provided on both surfaces of the base material, respectively. The first pressure sensitive adhesive layer is stuck to the foam composite sheet and the second pressure sensitive adhesive layer is for adhering to another member. As the base material provided for the double-sided pressure sensitive adhesive tape, various base materials such as a resin film, a paper material and a nonwoven fabric provided for conventional double-sided pressure sensitive adhesive tapes may be used.

The pressure sensitive adhesive for use as the first and the second pressure sensitive adhesive layer may be the pressure sensitive adhesive described above. The double-sided pressure sensitive adhesive tape may have a thickness same as the thicknesses described for the pressure sensitive adhesive layer in the above.

The pressure sensitive adhesive tape disposed in an electronic apparatus can be used as an impact absorber or a sealing material, while being used as a thermal insulator or a radiator in parallel, in the same manner as in the case of a foam composite sheet. The pressure sensitive adhesive tape is disposed inside an electronic apparatus in the same manner as in the case of a foam composite sheet, except for being adhered to another member (e.g. a heat sink, a display device, etc.) with the pressure sensitive adhesive layer. Accordingly the description thereof is omitted.

EXAMPLES

The present invention will be further described in detail with reference to Examples as follows, but the present invention is not limited to the Examples.

[Measurement Method]

The methods for measuring the respective physical properties herein are as follows.

<Amount of Metallic Thin Film Deposited>

The amount of a metallic thin film deposited was quantitatively measured with an X-ray fluorescence spectrometer (apparatus name: RIX 1000, manufactured by Rigaku Corporation). A sheet was held with a measurement jig and an area of 1 cm$^2$ was irradiated with X-ray.

<Thickness of Foam Sheet>

The thickness of a foam sheet was measured with a dial gauge.

<Apparent Expansion Ratio>

The apparent density of a foam sheet was measured in accordance with JIS K6767. The reciprocal thereof was defined as the apparent expansion ratio.

<Degree of Cross-Linking (Gel Fraction)>

A test piece of about 100 mg is sampled from a foam sheet. The weight A (mg) of the test piece is accurately measured. Subsequently the test piece is immersed in 30 cm$^3$ of xylene at 105° C. and left standing for 24 hours, and is then filtered with a 200-mesh metal screen. Insoluble components on the metal screen are sampled and vacuum-dried. The weight B (mg) of the insoluble components is accurately measured. From the measured value, the gel % (mass %) is calculated based on the following formula.

$$\text{Gel \% (mass \%)} = 100 \times (B/A)$$

Example 1

To an extruder, 100 parts by mass of a polyethylene resin (trade name: PL1850G, manufactured by The Dow Chemical Company) obtained using a polymerization catalyst of metallocene compound, 3.5 parts by mass of azodicarbonamide as a thermally decomposable foaming agent, 0.4 parts by mass of a phenol antioxidant as an antioxidant, and 0.2 parts by mass of dilauryl thiodipropionate were supplied. The mixture was melt-kneaded at 140° C. to obtain a resin composition, which was then extruded to form a long sheet with a thickness of 0.3 mm.

Subsequently, both surfaces of the long sheet of the resin composition were irradiated with 4.5 Mrad electron beams at an accelerating voltage of 500 kV, so that the resin composition was cross-linked.

The resin composition was then continuously fed into a foaming furnace held at 250° C. with hot air and an infrared heater so as to foam by heating, and simultaneously stretched in the MD direction and the CD direction to obtain a foam sheet.

The foam sheet had a proportion of closed cells of 100%, an apparent expansion ratio of 5.0 cc/g, a gel fraction of 30 mass %, and a thickness of 0.3 mm.

The foam sheet was wound in a roll form and placed in the enclosed chamber of a sputtering apparatus. The pressure in the chamber was once reduced to $5 \times 10^{-6}$ Torr. Argon gas was then introduced to form a low-pressure argon gas atmosphere at a pressure of $7 \times 10^{-4}$ Torr. While the foam sheet was drawn at a running speed of 1.0 m/min, aluminum was sputtered on a surface of the foam sheet to form an aluminum metal film with an input power of 50 KWH. A foam composite sheet was thus obtained.

The foam composite sheet had an amount of the aluminum thin film deposited of 13.0 µg/cm$^2$. Further, the foam composite sheet had a 25% compressive strength of 90 KPa.

Examples 2 TO 4

Examples 2 to 4 were performed in the same manner as in Example 1, except that the amount of the aluminum thin film deposited was changed by changing the drawing rate of the foam sheet. In Example 2, the amount of the aluminum thin film deposited was 62.3 µg/cm$^2$, and the 25% compressive strength was 92 KPa. In Example 3, the amount of the aluminum thin film deposited was 115.2 µg/cm$^2$, and the 25% compressive strength was 89 KPa. In Example 4, the amount of the aluminum thin film deposited was 625.2 µg/cm$^2$, and the 25% compressive strength was 86 KPa.

Comparative Example 1

Comparative Example 1 was performed in the same manner as in Example 1, except that no aluminum thin film was formed on one surface of the foam sheet. The foam composite sheet had a 25% compressive strength of 90 KPa.

<Heat Insulation Test>

Figure 4:
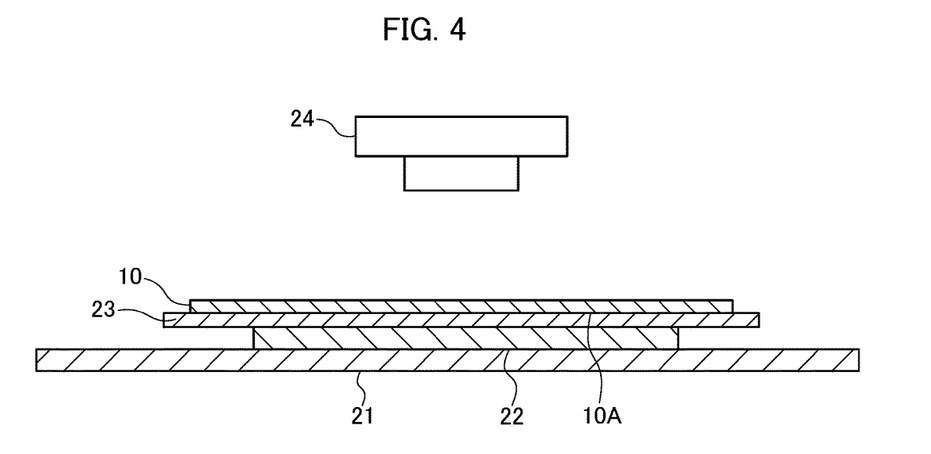
FIG. 4 is a schematic view illustrating a method for testing heat insulation.

As shown in FIG. 4, a heat source 22 was disposed on a thermal insulator 21. On the heat source 22, an SUS plate 23 with a thickness of 0.05 mm and a foam composite sheet 10 were disposed in this order. A thermoviewer 24 (trade name: CPA0306, manufactured by Chino Corp.) was disposed above the foam composite sheet 10. The foam composite sheet 10 was disposed such that a surface 10A provided with a metallic thin film was in contact with the SUS plate 23. As the heat source 22, a ceramic heater (trade name: MICRO-CERAMIC HEATER, manufactured by Sakaguchi E.H VOC Corp.) was used.

Heat was generated under conditions with a voltage of 100 V, and the temperature at the top surface of the foam composite sheet 10 was observed with the thermoviewer 24, every one minute for 10 minutes. The results of the heat insulation test in Examples and Comparative Example are shown in Table 1. The temperature shown in Table 1 is an average of three points.

TABLE 1

|  | Minutes | | | | | | | | | | |
|---|---|---|---|---|---|---|---|---|---|---|---|
|  | 0 | 1 | 2 | 3 | 4 | 5 | 6 | 7 | 8 | 9 | 10 |
| Example 1 | 28.4 | 34.1 | 38.1 | 40.2 | 41.7 | 42.9 | 43.7 | 44.3 | 44.7 | 45.1 | 45.5 |
| Example 2 | 28.5 | 34.1 | 37.9 | 40.0 | 41.0 | 42.7 | 43.3 | 43.8 | 44.3 | 44.8 | 45.1 |
| Example 3 | 28.0 | 33.9 | 36.5 | 39.5 | 40.1 | 41.8 | 42.7 | 43.2 | 43.9 | 44.3 | 44.5 |
| Example 4 | 28.7 | 33.5 | 35.8 | 38.9 | 39.5 | 40.9 | 41.5 | 42.3 | 42.8 | 43.3 | 43.7 |
| Comparative Example 1 | 28.3 | 35.1 | 40.0 | 42.9 | 44.9 | 46.1 | 46.9 | 47.8 | 48.3 | 48.9 | 49.1 |

Unit: ° C.

In Examples 1 to 4, as shown in the results of the heat insulation test, the heat from a heat source was prevented from transferring to the top surface-side of the foam composite sheet due to the aluminum thin film provided on one surface of the foam composite sheet. Accordingly, it can be understood that the foam composite sheet had excellent heat insulation performance. Furthermore, in Examples 1 to 4, as shown in the 25% compressive strength, the impact absorption performance and the sealing properties were excellent. In contrast, in Comparative Example 1, although the impact absorption performance and the sealing properties were excellent as shown in the 25% compressive strength, the heat insulation performance was insufficient as shown in the heat insulation test results because no metallic thin film was provided.

Example 5

To an extruder, 100 parts by mass of a polyethylene resin (trade name: PL1850G, manufactured by The Dow Chemical Company) obtained using a polymerization catalyst of metallocene compound, 15.0 parts by mass of azodicarbonamide as a thermally decomposable foaming agent, 300 parts by mass of magnesium oxide (RF-10-SC, manufactured by Ube Material Industries, Ltd., average particle diameter: 5 μm, thermal conductivity: 50 W/m·K), 3.5 parts by mass of a phenol antioxidant as an antioxidant, and 1.8 parts by mass of dilauryl thiothpropionate were supplied. The mixture was melt-kneaded at 140° C. to obtain a resin composition, which was then extruded to form a long sheet with a thickness of 0.3 mm.

Subsequently, both surfaces of the long sheet of the resin composition were irradiated with 4.5 Mrad electron beams at an accelerating voltage of 500 kV, so that the resin composition was cross-linked.

The resin composition was then continuously fed into a foaming furnace held at 250° C. with hot air and an infrared heater so as to foam by heating, and simultaneously stretched in the MD direction and the CD direction to obtain a foam sheet.

The foam sheet had a proportion of closed cells of 100%, an apparent expansion ratio of 5.1 cc/g, a gel fraction of 26 mass %, and a thickness of 0.3 mm. Subsequently, an aluminum metal thin film was formed in the same manner as in Example 1 so as to obtain a foam composite sheet. The foam composite sheet had an amount of the aluminum thin film deposited of 12.8 μg/cm$^2$ and a 25% compressive strength of 92 KPa.

The foam composite sheet in Example 5 provided between a heat source and a heat sink as shown in FIG. 3 resulted in a lower temperature at the rear side of the substrate than the foam sheet in Comparative Example 1 provided there. It can be understood that the foam composite sheet in Example 5 had excellent radiation properties.

REFERENCE SIGNS LIST

10: Foam composite sheet
12 and 22: Heat source
13: Heat sink
18: Display device

The invention claimed is:

1. A foam composite sheet consisting of a polyolefin resin foam sheet and a metallic thin film provided on at least one surface of the foam sheet, wherein the foam sheet has closed cells and the metallic thin film is formed of aluminum and optionally one or more materials selected from the group consisting of copper, silver, nickel, titanium, stainless steel, a nickel-copper alloy, aluminum oxide, zinc oxide, and titanium nitride in an amount of deposition of 10 to 115.2 μg/cm$^2$.

2. The foam composite sheet according to claim 1, wherein the metallic thin film is formed of aluminum and optionally one or more materials selected from the group consisting of stainless steel, a nickel-copper alloy, copper, silver, titanium and nickel.

3. The foam composite sheet according to claim 1, wherein the polyolefin resin foam sheet has a thickness of 0.05 to 1.0 mm.

4. The foam composite sheet according to claim 1, wherein the polyolefin resin foam sheet has an apparent expansion ratio of 1.0 to 10 cc/g.

5. The foam composite sheet according to claim 1, wherein the polyolefin resin foam sheet has a gel fraction of 5 to 70 mass %.

6. The foam composite sheet according to claim 1, wherein the polyolefin resin foam sheet is formed of a foamed resin composition comprising a polyethylene resin.

7. The foam composite sheet according to claim 1, wherein the metallic thin film is formed by sputtering.

8. The foam composite sheet according to claim 1, wherein the polyolefin resin foam sheet comprises a thermally conductive filler dispersed therein.

9. A pressure sensitive adhesive tape comprising a foam composite sheet according to claim 1 and a pressure sensitive adhesive layer provided on at least one surface of the foam composite sheet.

* * * * *